(12) United States Patent
Fukutani et al.

(10) Patent No.: US 7,282,268 B2
(45) Date of Patent: Oct. 16, 2007

(54) STRUCTURE, METHOD OF MANUFACTURING THE SAME, AND DEVICE USING THE SAME

(75) Inventors: Kazuhiko Fukutani, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 193 days.

(21) Appl. No.: 10/912,206

(22) Filed: Aug. 6, 2004

(65) Prior Publication Data

US 2005/0053773 A1 Mar. 10, 2005

Related U.S. Application Data

(63) Continuation of application No. PCT/JP03/01368, filed on Feb. 10, 2003.

(30) Foreign Application Priority Data

Feb. 12, 2002 (JP) ............................. 2002-034006
Nov. 25, 2002 (JP) ............................. 2002-340944

(51) Int. Cl.
  *B32B 9/06* (2006.01)
(52) U.S. Cl. ...................... 428/446; 428/450; 428/701; 428/702
(58) Field of Classification Search ...................... None
  See application file for complete search history.

(56) References Cited

U.S. PATENT DOCUMENTS

| 5,240,558 | A | 8/1993 | Kawasaki et al. | ........ 156/659.1 |
| 5,244,828 | A | 9/1993 | Okada et al. | .................. 437/81 |
| 5,369,873 | A | 12/1994 | Walters et al. | .................. 29/599 |
| 6,027,796 | A | 2/2000 | Kondoh et al. | .......... 428/312.8 |
| 6,602,620 | B1 | 8/2003 | Kikitsu et al. | ........... 428/694 T |
| 2001/0042502 | A1 | 11/2001 | Shih et al. | ..................... 117/3 |
| 2002/0167013 | A1 | 11/2002 | Iwasaki et al. | ................ 257/79 |
| 2003/0175472 | A1 | 9/2003 | Den et al. | .................. 428/66.6 |
| 2004/0033339 | A1 | 2/2004 | Fukutani et al. | ............. 428/137 |
| 2004/0043208 | A1 | 3/2004 | Fukutani et al. | .......... 428/304.4 |
| 2004/0048092 | A1 | 3/2004 | Yasui et al. | .................. 428/642 |

FOREIGN PATENT DOCUMENTS

| EP | 0 851 506 A2 | 7/1998 |
| JP | 58-142523 | 8/1983 |
| JP | 5-55545 | 3/1993 |
| JP | 9-157062 | 6/1997 |
| JP | 11031862 A | 2/1999 |
| JP | 11251334 A | 9/1999 |
| JP | 2001-261376 | 9/2001 |

OTHER PUBLICATIONS

M. Jacobs, Unbalanced magnetron sputtered Si-Al coatings: plasma conditions and film properties versus sample bias voltage, (1999) pp. 735-774.
C.D. Adams, Transition from lateral to transverse phase separation during film co-deposition, (Nov. 11, 1991) pp. 2535-2537.
M. Atzmon, Phase separation during film growth (Jul. 1992) pp. 442-446.
C.D. Adams, Monte Carlo simulation of phase separation during thin-film codeposition, (Aug. 1, 1993) pp. 17071715.
C.D. Adams, Phase separation during co-deposition of Al-Ge thin films, (Mar. 1992).

*Primary Examiner*—Jennifer C. McNeil
*Assistant Examiner*—Timothy M. Speer
(74) *Attorney, Agent, or Firm*—Fitzpatrick, Cella, Harper & Scinto

(57) ABSTRACT

A composite structure is formed so as to contain aluminum and silicon or silicon/germanium. The composite structure comprises pillar-shaped members containing aluminum and a region containing silicon or silicon/germanium and surrounding the pillar-shaped members. The structure contains silicon or silicon/germanium at a content not less than 20 atomic % and not more than 70 atomic % relative to the total amount aluminum and silicon or silicon/germanium.

27 Claims, 8 Drawing Sheets

FIG. 8 ial Appli-
STRUCTURE, METHOD OF MANUFACTURING THE SAME, AND DEVICE USING THE SAME This application is a continuation of International Application No. PCT/JP03/01368, filed on Feb. 10, 2003, which claims the benefit of Japanese Patent Application Nos. 2002-034006 filed on Feb. 12, 2002, 2002-340944 filed on Nov. 25, 2002.

BACKGROUND OF THE INVENTION

1. Field of the Invention

This invention relates to a structure comprising pillar-shaped members, a method of manufacturing such a structure and a device using such a structure.

2. Related Background Art

Interests in microstructures have been growing in resent years from the viewpoint of utilizing them as functional materials.

Techniques that can be used for preparing such microstructures include those of directly preparing microstructures by utilizing semiconductor processing technologies, of which micro-pattern forming technologies such as photolithography are well known (see, inter alia, Japanese Patent Application Laid-Open No. H5-055545 (p. 3, FIG. 1).

Apart from semiconductor processing technologies, techniques that utilize self-organization phenomena and self-formation phenomena of materials are also known. Such techniques are devised to realize novel microstructures on the basis of regular structures that are formed in nature.

While a number of studies have been made on self-organization phenomena and self-formation phenomena because techniques that utilize such phenomena may feasibly be used to realize structures of dimensions of microns or even nanometers, there is still a strong demand for novel microstructures and methods of reliably manufacturing them.

SUMMARY OF THE INVENTION

In view of the above circumstances, it is therefore an object of the present invention to provide a novel structure, a method of manufacturing such a novel structure and a device that can be realized by utilizing such a novel structure.

In an aspect of the present invention, there is provided a structure containing a first material and a second material, the structure comprising pillar-shaped members containing the first material and a region containing the second material and surrounding the pillar-shaped members provided that the second material is not composed of only germanium, the structure containing the second material at a content not less than 20 atomic % and not more than 70 atomic % relative to the total amount of the first and second materials.

The first material may typically be aluminum and the second material may typically be silicon or a mixture of silicon and germanium. The average diameter (or major axis if the pillar-shaped members show an elliptic plan view) of the pillar-shaped members may typically be not more than 50 nm and the gaps separating the centers of any adjacent ones of the pillar-shaped members contained in the structure is typically not more than 30 nm.

In another aspect of the present invention, there is provided a method of manufacturing a structure, comprising a step of preparing a substrate and a step of forming a film on the substrate in a non-equilibrium state, the film having a structure comprising pillar-shaped members containing a first material and a region containing a second material and surrounding the pillar-shaped members provided that the second material is not composed of only germanium, the structure containing the second material at a content not less than 20 atomic % and not more than 70 atomic % relative to the total amount of the first and second materials.

The present invention also provides a device realized by comprising a structure according to the invention. For example, an electronic device according to the invention is realized by forming an insulated region on a structure according to the invention. An electronic device according to the invention may include single-electron transistors or single-electron memories or may include an information processing apparatus comprising such devices.

The present invention provides a film-shaped aluminum silicon composite structure, comprising pillar-shaped structures containing aluminum and a silicon region surrounding the pillar-shaped structures, the composite structure containing silicon at a content not less than 20 atomic % and not more than 70 atomic %.

The present invention also provides a film-shaped aluminum silicon germanium composite structure, comprising pillar-shaped structures containing aluminum and a silicon germanium region surrounding the pillar-shaped structures, the composite structure containing silicon and germanium at a combined content not less than 20 atomic % and not more than 70 atomic %.

The present invention also provides a structure comprising a plurality of pillar-shaped members and a region surrounding the lateral surfaces of the plurality of pillar-shaped members, the pillar-shaped members having a diameter not more than 20 nm, the distance between the centers of any two adjacently located ones of the pillar-shaped members being not more than 30 nm.

The present invention further provides a structure comprising pillar-shaped members containing aluminum and a region surrounding the pillar-shaped members, the pillar-shaped members and the region being formed simultaneously, the pillar-shaped members having a diameter not more than 20 nm.

A structure (e.g., aluminum silicon composite structure) comprising pillar-shaped members according to the invention may find applications as matrix that can be used for various devices. For example, it may find applications in various quantum devices including single-electron transistors and single-electron memories.

BRIEF DESCRIPTION OF THE DRAWINGS

FIG. 8 is an FE-SEM image of still another embodiment of aluminum silicon composite structure according to the invention;

DESCRIPTION OF THE PREFERRED EMBODIMENTS

Now, the present invention will be described in detail.

Embodiment 1

An embodiment of structure according to the invention will be described by referring to FIGS. 1A and 1B.

Figure 1A:
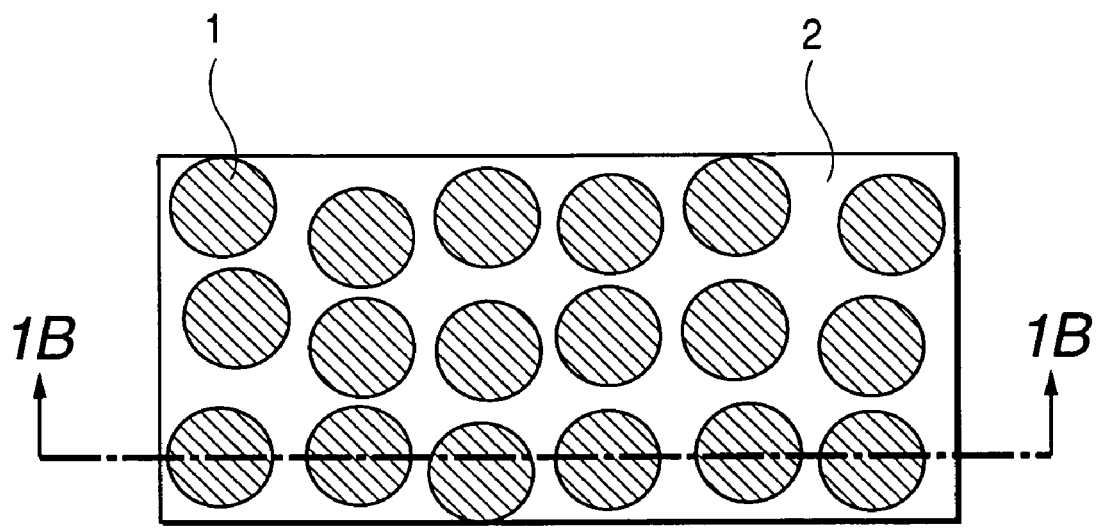
FIG. 1A is a schematic plan view of an embodiment of structure according to-the invention.
Figure 1B:
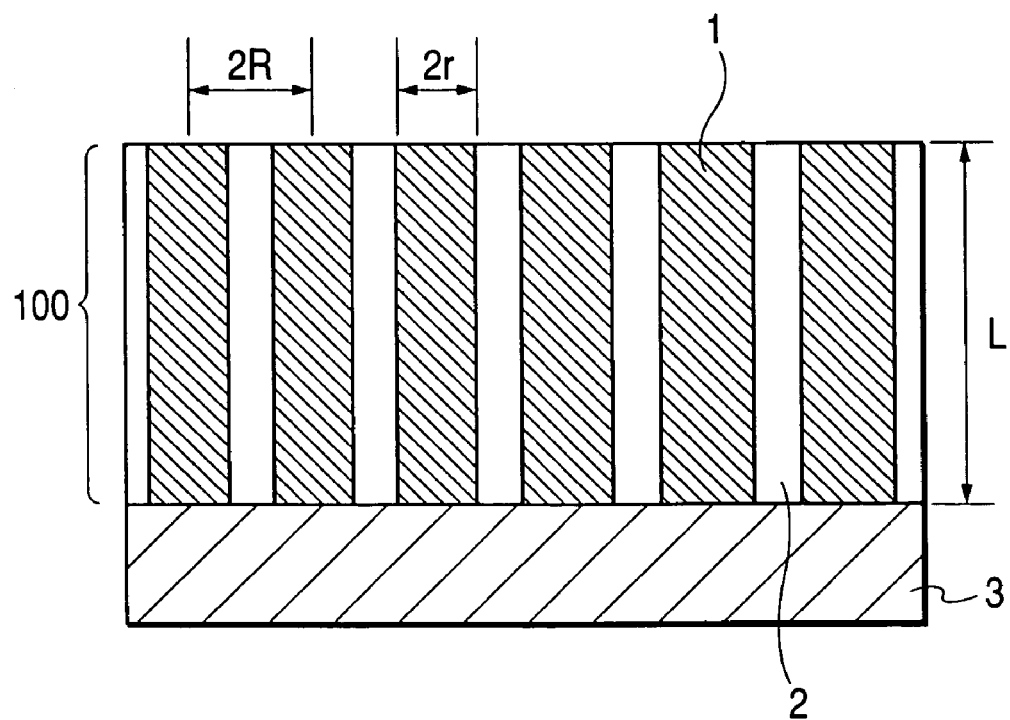
FIG. 1B is a schematic cross sectional lateral view of the embodiment of FIG. 1A taken along line 1B-1B.

FIGS. 1A and 1B illustrate that pillar-shaped members 1 are distributed in a region 2 surrounding them. FIG. 1A is a schematic plan view of the embodiment and FIG. 1B is a schematic cross sectional view of the embodiment taken along line 1B-1B. In FIG. 1B, reference symbol 3 denotes a substrate.

The structure 100 illustrated in FIGS. 1A and 1B comprises pillar-shaped members 1 composed so as to contain a first material and surrounded by a region 2 composed so as to contain a second material. The structure 100 contains the second material at a content of not less than 20 atomic % and not more than 70 atomic % relative to the total amount of the first and second materials. As will be demonstrated hereinafter by referring to the succeeding embodiments, the inventors of the present invention found that it is possible to provide a structure comprising substantially pillar-shaped members distributed in a matrix region that surrounds them when the ratio of the second material is within the above defined range relative to the total amount of the first material and the second material. If the substrate on which the structure is formed has a flat profile and is disposed horizontally, the pillar-shaped members are arranged generally vertically so as to stand upright, although the mode of arrangement of pillar-shaped members depends on the profile of the underlying substrate on which the structure is formed.

The above defined content refers to the ratio of the second material relative to the total amount of the first material and the second material of the structure. The content is preferably not less than 25 atomic % and not more than 65 atomic %, more preferably not less than 30 atomic % and not more than 60 atomic %. The content can be determined by quantitatively analyzing the structure, for example, by means of inductively coupled plasma atomic emission spectrometry (ICP-AES).

For the purpose of the present invention, it is necessary and sufficient that pillar-shaped members are substantially realized. The pillar-shaped members may contain the second material and/or the region may contain the first material. The pillar-shaped members and/or the surrounding region may contain impurities such as oxygen, argon, etc.

Substances that can be used for the first material include Al (aluminum) and Au (gold). Substances that can be used for the second material include Si (silicon), Ge (germinium), a mixture of Si and Ge (which may be expressed $Si_xGe_{1-x}$ ($0<x<1$) hereinafter) and C. Particularly, it is preferable that the second material is selected from materials that can become amorphous.

The first and second materials preferably have an eutectic point in the phase equilibrium diagram of the binary system. Particularly, the eutectic temperature preferably is not lower than 300° C., more preferably not lower than 400° C. Eutectoid materials may also be used as the first and second materials.

Preferable combinations of the first material and the second material include one using Al and Si respectively for the first and second materials and one using Al and $Si_xGe_{1-x}$ ($0<x<1$) respectively for the first and second materials.

Preferably, the pillar-shaped members are at least partly polycrystalline and the region surrounding the pillar-shaped members is amorphous. The pillar-shaped members show a circular or elliptic plan view.

Thus, in the structure, the pillar-shaped members are distributed in the matrix composed so as to contain the second material. While the diameters (or major axes in the case where the pillar-shaped members do not show a circular plan view) of the pillar-shaped members can be controlled mainly by e.g. considering the composition of the structure (or the ratio of the second material), the average diameter is not less than 0.5 nm and not more than 50 nm, preferably not less than 1 nm and not more than 20 nm, more preferably not less than 2 nm and not more than 10 nm. The average diameter is most preferably less than 20 nm. The diameter as used herein refers to 2r in FIG. 1B. In the case where the pillar-shaped members show an elliptic or other plan view, it is necessary and sufficient that the greatest axes corresponding to the diameters in the case of circular plan view are found within the above defined range. The average diameter refers to the value that is obtained from the images of the pillar-shaped members that can be observed in an SEM photograph (of an area of about 100 nm×100 nm) directly or by processing the photograph by means of a computer. It should be noted here that the optimum values of the diameter and the gap as defined below can vary depending on the materials and the composition involved and the application of the structure.

The distance 2R between the centers of any two adjacently located pillar-shaped members (FIG. 1B) is not less than 2 nm and not more than 30 nm, preferably not less than 5 nm and not more than 20 nm, more preferably not less than 5 nm and not more than 15 nm. Of course, the smallest distance 2R between the centers of any two adjacently located pillar-shaped members needs to be such that the two pillar-shaped structures do not contact each other. If the second material (the material contained in the region surrounding the pillar-shaped members) is a mixture of a plurality of elements (e.g., $Si_xGe_{1-x}$), the distance between the centers of any two adjacently located pillar-shaped members can be controlled by way of the mixing ratio of elements.

Preferably, the structure is a film-shaped structure. If such is the case, the pillar-shaped members are distributed in the matrix composed so as to contain the second material in such a way that they are substantially perpendicular relative to the intra-surface direction. While the film thickness of a film-shaped structure is not particularly limited, it may normally be between 1 nm and 100 μm. More preferably, it may be between 1 nm and 1 μm or between 1 nm and 3 μm from a realistic viewpoint of considering the process time. Particularly, it is preferable that the pillar-shaped structures are maintained even when the film thickness is not less than 300 nm. The pillar-shaped members preferably do not substantially have any branches extending to upwardly or downwardly (in the longitudinal direction of the pillar-shaped members).

As pointed out above, the structure is preferably a film-shaped structure and may be arranged on a substrate. When a substrate is used, it is not subjected to any particular limitations. Substrates that can suitably be used for the purpose of the invention include insulator substrates such as quartz glass substrates, reinforced glass substrates, crystallized glass substrates or other glass substrates, substrates having an-insulating layer on the surface, semiconductor substrates including silicon substrates (including p-type, n-type, high resistance type, low resistance type, etc.), gallium substrates and indium phosphide substrates, metal substrates including aluminum substrates and flexible substrates (e.g., polyimide resin substrates) provided that the substrate operates as support member and a structure according to the invention can be formed on it.

It is possible to provide an electronic device by forming an insulating film on a structure according to the invention. The expression of an electronic device as used herein refers to a single-electron transistor, a single-electron memory or the like. For the purpose of the invention, an electronic device may be an information processing apparatus comprising such devices.

A structure according to the invention (which may also be referred to as composite structure hereinafter) may find applications as matrix that can be used for various devices. For example, it may find applications in various quantum devices including single-electron transistors and single-electron memories and also in micro-electrodes, etc.

A structure according to the invention (e.g., an aluminum silicon composite structure) can be used as dry or wet etching mask for the purpose of processing some other substrate or a film formed on some other substrate.

According to the invention, pillar-shaped structures such as quantum dots or quantum wires can be utilized in various different ways to remarkably broaden the scope of utilization of such structures. A structure according to the invention can be used as self-functioning material by itself.

(Manufacturing Method)

A structure according to the invention can be prepared by utilizing a method of forming a film in a non-equilibrium state. While a sputtering method is preferably used for forming a film for the purpose of the invention, some other film forming method adapted to form a film in an appropriately selected non-equilibrium state such as a resistance heating evaporation method, an electron beam evaporation (EB evaporation) method or an ion plating method may alternatively be used. If a sputtering method is used, it may be a magnetron sputtering method, an RF sputtering method, an ECR sputtering method or a DC sputtering method. When a film forming process is conducted by using a sputtering method, it is conducted in a reaction furnace containing an argon atmosphere whose internal pressure is held to a level between 0.2 and 1 Pa or between 0.1 and 1 Pa. While the first material and the second material may be used separately as target materials for the sputtering operation (e.g., as separate aluminum and silicon target materials), a target material obtained by sintering the first material and the second material that are mixed to a desired ratio may alternatively be used. For this embodiment of structure, pillar-shaped members and a region surrounding the lateral surfaces of the pillar-shaped members are formed simultaneously. Preferably, the sputtering operation is conducted without bringing plasma into contact with the substrate on which a film is grown.

A structure according to the invention can maintain a state where the members having a pillar-shaped structure are distributed in a region surrounding the lateral surfaces of the members even if the film is formed to a thickness greater than a predetermined value. In other words, even if the film thickness is unexpectedly large, the diameter of the pillar-shaped structures would not vary significantly. The predetermined film thickness is not less than 110 nm, preferably not less than 300 nm.

The structure is formed on a substrate whose temperature is not higher than 300° C., preferably not lower than 20° C. and not higher than 200° C., more preferably not lower than 100° C. and not higher than 150° C.

Embodiment 2

Aluminum Silicon Composite Structure

A structure containing aluminum and silicon respectively as the first and second materials will be described also by referring to FIGS. 1A and 1B.

FIG. 1A is schematic plan view of an aluminum silicon composite structure according to the invention. FIG. 1B is a schematic cross sectional view of the specimen taken along line 1B-1B in FIG. 1A. In FIGS. 1A and 1B, reference symbols 1 and 2 respectively denote pillar-shaped structures including aluminum and a region surrounding the pillar-shaped structures. In FIG. 1B, reference symbol 3 denotes a substrate.

The aluminum silicon composite structure 100 formed on the substrate 3 contains silicon at a content not less than 20 atomic % and not more than 70 atomic %, preferably not less than 25 atomic % and not more than 65 atomic %, more preferably not less than 30 atomic % and not more than 60 atomic %, relative to the total amount of aluminum and silicon. An aluminum silicon composite structure in which pillar-shaped structures 1 are distributed in a silicon region 2 is obtained when the ratio of silicon is found within the above defined range.

The content (atomic %) represents a value obtained by quantitatively analyzing the amount of silicon and that of aluminum in the film-shaped aluminum silicon composite structure by means of inductively coupled plasma atomic emission spectrometry.

While atomic % is used above as unit for expressing the content, wt % may alternatively be used as unit. If such is the case, the expression of not less than 20 atomic % and not more than 70 atomic % is replaced by an expression of not less than 20.65 wt % and not more than 70.84 wt % (obtained as a result of reductions using 26.982 and 28.086 for the atomic amounts of Al and Si respectively).

An aluminum silicon composite structure 100 according to the invention comprises aluminum pillar-shaped structures containing aluminum as principal ingredient and a silicon region surrounding them and containing silicon as principal ingredient.

While the pillar-shaped structure section 1 contains aluminum as principal ingredient, they may additionally contain silicon, oxygen and/or argon as other ingredients so long as a microstructure having pillar-shaped structures is obtained. The expression of principal ingredient as used herein refers to the composition of the pillar-shaped structure section where the aluminum content is not less than 50 atomic %, preferably not less than 80 atomic %.

While the silicon region that surrounds the pillar-shaped structures contains silicon as principal ingredient, it may additionally contain aluminum, oxygen and/or argon as other ingredients so long as a microstructure having pillar-shaped structures is obtained. The expression of principal ingredient as used herein refers to the composition of the silicon region where the silicon content is not less than 50 atomic %, preferably not less than 80 atomic %.

Desirably, the silicon region is amorphous. From the viewpoint of insulating effect, it is desirable that the silicon region is made of amorphous silicon because a higher electric insulating effect of the matrix material separating the pillar-shaped structures are obtained due to a greater band gap and a higher defect density when amorphous silicon is used than when crystalline silicon is used.

A composite structure according to the invention is in a state where aluminum is isolated in a silicon matrix.

(Structure)

The pillar-shaped structures 1 that contain aluminum usually show a circular or elliptic shape as viewed in plan. Of course, they may show any other plan view so long as they are appropriately distributed in the silicon region 2.

While there are no particular limitations to the diameter of the pillar-shaped structures of an aluminum silicon composite structure according to the invention, the average diameter is not less than 0.5 nm and not more than 50 nm, preferably not less than 0.5 nm and not more than 20 nm, more preferably not less than 0.5 nm and not more than 10 nm. The diameter as used herein refers to $2r$ in FIG. 1B. In the case where the pillar-shaped structures show an elliptic or other plan view, it is necessary and sufficient that the greatest axes corresponding to the diameters in the case of circular plan view are found within the above defined range. The average diameter refers to the value that is obtained from the images of the pillar-shaped structures of aluminum that can-be observed in an SEM photograph (of an area of about 100 nm×100 nm) by processing the photograph by means of a computer.

Meanwhile, a nano-structure having a diameter of nanometers (in a range between about 0.1 nm and 100 nm) can show peculiar electric, optical and chemical properties when the dimensions are made smaller than a characteristic value because movements of electrons are confined in such a condition. Thus, a nano-structure that is used as functional material can be very useful from this viewpoint. An aluminum silicon composite structure according to the invention can be utilized in various different ways as nano-structure when the pillar-shaped structures it comprises show a diameter not less than 0.5 nm and not more than 50 nm, particularly not less than 0.5 nm and not more than 10 nm.

The distance $2R$ between the centers of any two adjacently located pillar-shaped structures (FIG. 1B) is not more than 30 nm, preferably not more than 15 nm. Of course, the distance $2R$ between the centers of any two adjacently located pillar-shaped structures needs to be such that the two pillar-shaped structures do not contact each other. Particularly, it is desirable that both the average diameter $2r$ of the pillar-shaped structures and the distance $2R$ between the centers of any two adjacently located pillar-shaped structures are found within the above defined respective ranges.

A typical microstructure according to the invention comprises aluminum nano-structures having a diameter between 1 and 9 nm, the distance between the centers of any two adjacently located aluminum nano-structures being between 5 and 10 nm, the ratio-of the height to the diameter of the aluminum nano-structures being between 0.1 and 100,000, the aluminum nano-structures being arranged perpendicularly relative to the substrate.

As illustrated in FIG. 1B, the pillar-shaped structures 1 may preferably show a rectangular cross sectional view taken through the substrate. Alternatively, they may show a square or trapezoidal cross sectional view. The pillar-shaped structures may show a profile with an appropriate aspect ratio (length/diameter). The aspect ratio (length L/diameter $2r$) may be between 0.1 and 100,000.

For example, the length L of the pillar-shaped structures may be between 1 nm and 100 μm.

Particularly, assuming that the diameter $2r$ of the pillar-shaped structures is between 1 and 10 nm and the distance $2R$ between the centers of any two adjacently located pillar-shaped structures is between 5 and 15 nm, the length L can be controlled so as to be between 1 nm and several μm in a manner as described below. The pillar-shaped structures 1 operate as aluminum quantum dots when the length L is between several nm and tens of several nm (and hence the ratio of the length to the diameter is small), whereas they operate as aluminum quantum wires when the length L is greater.

As shown in FIG. 1B, the pillar-shaped structures 1 that contain aluminum are separated from each other by the silicon region that contains silicon as principal ingredient. In other words, a number of pillar-shaped structures are distributed in the silicon region.

Preferably, the pillar-shaped structures 1 that contain aluminum are arranged in a specific direction. Particularly, they are arranged in a direction perpendicular to the substrate as shown in FIG. 1B.

While the substrate 3 is not subjected to particular limitations, it may be selected from insulator substrates such as quartz glass substrates, semiconductor substrates including silicon substrates, gallium arsenide substrates and indium phosphide substrates, and flexible substrates (e.g., polyimide resin substrates) provided that the substrate operates as support member and an aluminum silicon composite structure according to the invention can be formed on it. Further, substrates on which one or more than one film layers are formed may also be used.

Embodiment 3

Method of Preparing an Aluminum Silicon Composite Structure

Figure 2:
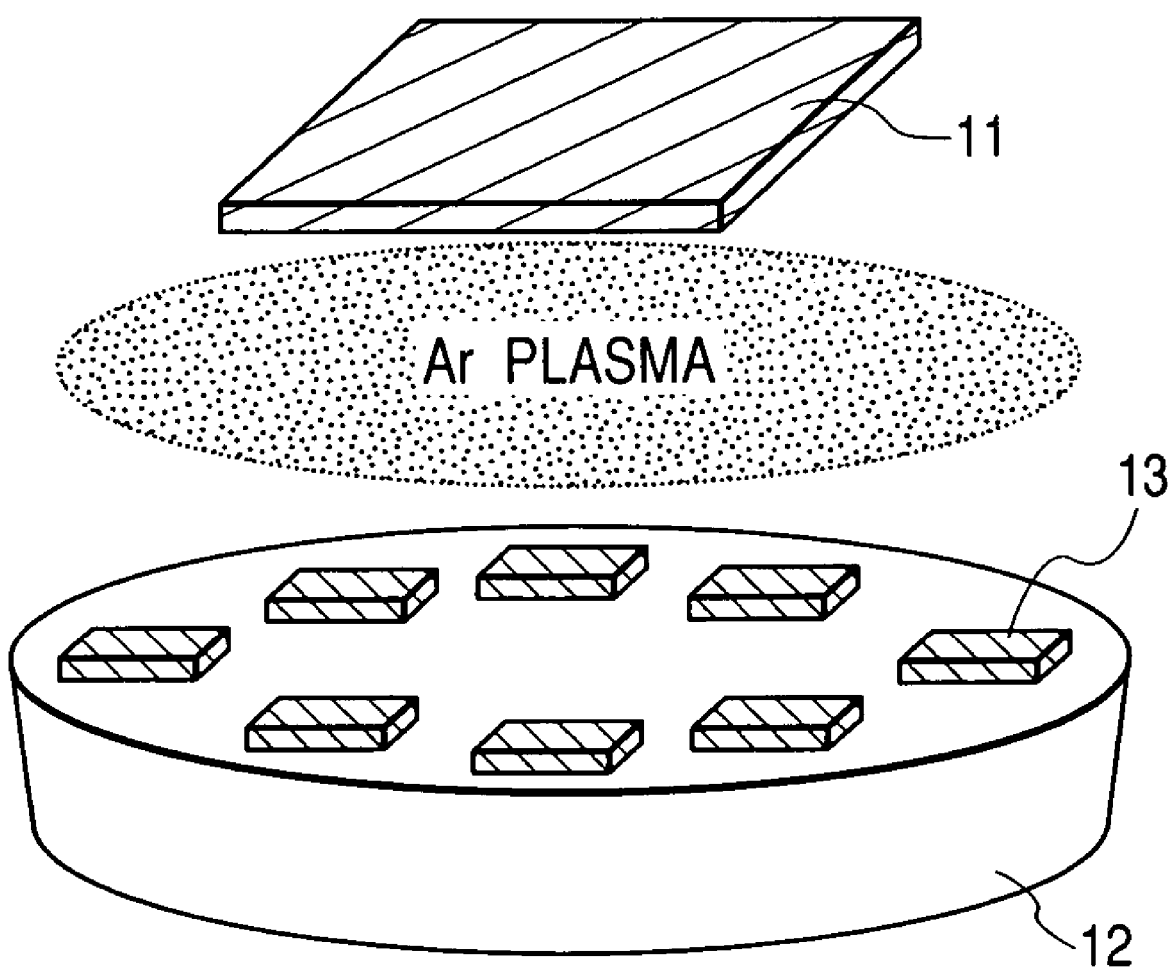
FIG. 2 is a schematic perspective view of a structure according to the invention, illustrating a method of preparing it.

Now, a method of preparing an aluminum silicon composite structure according to the invention will be described by referring to FIG. 2. More specifically, a sputtering method is used for preparing an aluminum silicon composite structure as exemplary method for forming a film in a non-equilibrium state in the following description. In FIG. 2, reference symbols 11 and 12 respectively denote a substrate and a sputtering target. The ratio of the aluminum content to the silicon content can be easily modified when a sputtering method is used.

As shown in FIG. 2, an aluminum silicon composite film is formed on a substrate by means of a magnetron sputtering method that is a method for forming a film in a non-equilibrium state.

Raw materials of silicon and aluminum are provided properly by arranging silicon chips on an aluminum target substrate as shown in FIG. 2. While a number of silicon chips are arranged on the aluminum target substrate in FIG. 2, the arrangement of silicon is not limited to it. Only a single silicon chip may alternatively be arranged on the aluminum target substrate so long as a desired film is formed. Note however, silicon chips are preferably arranged symmetrically on the substrate 11 if aluminum-containing pillar-shaped structures are to be uniformly distributed in a silicon region.

It is also possible to use a baked aluminum/silicon body prepared by baking a predetermined amount of powder of aluminum and silicon as target.

Similarly, it is also possible to perform a sputtering process simultaneously on an aluminum target and a silicon target that are prepared separately.

The silicon content of the film that is produced by sputtering is not less than 20 atomic % and not more than 70 atomic %, preferably not less than 25 atomic % and not more than 65 atomic %, more preferably not less than 30 atomic % and not more than 60 atomic % relative to the total amount of aluminum and silicon.

The substrate temperature is not higher than 300° C., preferably not lower than 20° C. and not higher than 200° C., more preferably not lower than 100° C. and not higher than 150° C. If the silicon content is found within the above defined range, an aluminum silicon composite structure comprising pillar-shaped structures distributed in a silicon region is obtained.

The temperature of the specimen of aluminum silicon composite film being formed is typically not higher than 300° C., preferably not higher than 200° C. When a composite film of aluminum and silicon is formed by means of a method of forming a film of substances in a non-equilibrium state at specimen temperature not higher than 300° C., the prepared aluminum silicon composite film shows an eutectic composition where aluminum and silicon are in a metastable state and aluminum forms pillar-shaped nano-structures of dimensions of several nm and becomes separated in a self-forming manner.

The silicon content of an aluminum silicon composite structure according to the invention can be controlled typically by arranging an appropriate amount of silicon chips on an aluminum target.

When a film is formed in a non-equilibrium state particularly by sputtering, the pressure in the reactor in which argon gas is made to flow is preferably between 0.2 and 1 Pa or between 0.1 and 1 Pa, although the pressure is by no means limited to the above range so long as argon plasma is produced on a stable basis under that pressure.

The substrate 11 may be selected from insulator substrates such as quartz glass substrates, semiconductor substrates including silicon substrates and gallium arsenide substrates and substrates on which one or more than one film layers are formed. The material, the thickness and the mechanical strength of the substrate are not subjected to any particular limitations so long as it does not provide any problem for forming an aluminum silicon nano-structure. The profile of the substrate is not limited to that of a smooth and flat plate. In other words, the surface of the substrate may be curved or have undulations or steps to a certain extent. Thus, there are no particular limitations to the profile of the substrate so long as a desired aluminum silicon nano-structure is formed properly.

The method of forming a film of substances in a non-equilibrium state to be used for this embodiment is preferably a sputtering method, although some other appropriate method of forming a film of substances in a non-equilibrium state may be used. More specifically, a resistance heating evaporation method, an electron beam evaporation (EB evaporation) method or an ion plating method may be used for this embodiment.

For forming a film, a simultaneous film forming process of forming a film of silicon and aluminum at the same time may be used. Alternatively, a multilayer film forming process of forming several atomic layers of silicon and those of aluminum successively may be used.

Embodiment 4

Device Comprising an Aluminum Silicon Composite Structure

Figure 5:
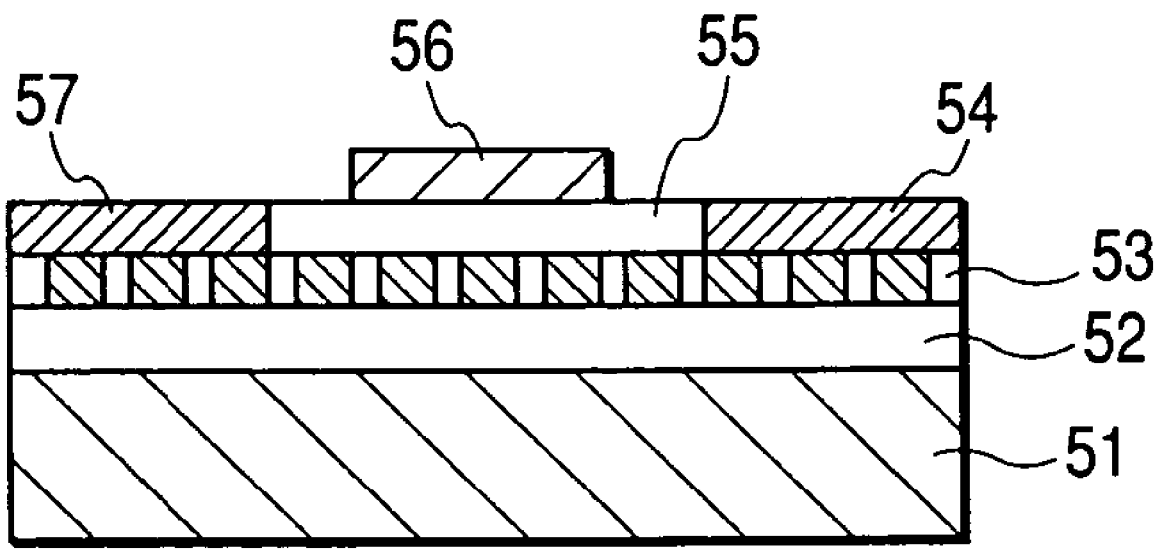
FIG. 5 is a schematic cross sectional view of a single-electron transistor realized by using a structure according to the invention.

FIG. 5 is a schematic cross sectional view of a single-electron transistor realized by using an aluminum silicon composite structure according to the invention. As aluminum is used as quantum dots as shown in FIG. 5, the electric current flowing between the source and the drain can be made on and off by controlling the voltage applied to the gate electrode. Thus, the device of FIG. 5 operates as transistor. In FIG. 5, there are shown a substrate 51, an insulating body (e.g., silicon oxide body) 52, an aluminum silicon composite structure 53, a drain electrode 54, a gate insulator (insulating film) 55, a gate electrode 56 and a source electrode 57. Of course, a composite structure made of materials other than aluminum and silicon may be used in place of the aluminum silicon composite structure 53 so long as such a structure comprises pillar-shaped structures. More specifically, silicon of the aluminum silicon composite structure 53 may be replaced by silicon and germanium so long as a structure comprising distributed pillar-shaped structures are realized.

A single-electron memory that utilizes the quantum effect, or a single-electron transistor, can be formed by using an aluminum silicon structure prepared in a manner as described above.

According to the invention, aluminum nano-structures such as quantum dots or quantum wires can be utilized in various different ways to remarkably broaden the scope of utilization of such structures. A structure according to the invention can be used as self-functioning material by itself.

Embodiment 5

The Composition of an Aluminum Silicon Germanium Composite Structure

The use of aluminum and $Si_xGe_{1-x}$ (0<x<1) respectively as the first material for forming pillar-shaped members and as the second material will be described by referring to FIGS. 1A and 1B again.

FIG. 1A is schematic plan view of an aluminum silicon germanium composite structure according to the invention. FIG. 1B is a schematic cross sectional view of the specimen taken along line 1B-1B in FIG. 1A. In FIGS. 1A and 1B, reference symbols 1 and 2 respectively denote aluminum-containing pillar-shaped structures and a silicon germanium region surrounding the pillar-shaped structures. In FIG. 1B, reference symbol 3 denotes a substrate.

An aluminum silicon germanium composite structure 100 formed on the substrate 3 contains silicon and germanium, the combined content of silicon and germanium being hot less than 20 atomic % and not more than 70 atomic %, preferably not less than 25 atomic % and not more than 65 atomic %, more preferably not less than 30 atomic % and not more than 60 atomic %, relative to the total amount of aluminum, silicon and germanium. An aluminum silicon germanium composite structure in which pillar-shaped structures 1 are distributed in a silicon germanium region 2 is obtained when the ratio of silicon germanium is found within the above defined range.

The combined content (atomic %) represents a value obtained by quantitatively analyzing the amount of silicon and germanium and that of aluminum in the film-shaped aluminum silicon germanium composite structure by means of inductively coupled plasma atomic emission spectrometry.

The combined content of silicon and germanium relative to the total amount of aluminum, silicon and germanium is expressed by (Si+Ge)/(Si+Ge+Al)×100, where Si is the silicon content, Ge is the germanium content and Al is the aluminum content. In other words, it is the combined content of Si+Ge expressed in terms of atomic % when Si+Ge+Al is 100 atomic %.

The content ratio of silicon to germanium in the silicon germanium region of an aluminum silicon germanium nano-structure according to the invention is not particularly limited. In other words, it is necessary and sufficient that the silicon germanium region contains at least both silicon and germanium. If the con-tent ratio of silicon (Si) to germanium (Ge) is expressed by $Si_xGe_{1-x}$, it is necessary and sufficient that 0<x<1. When the content ratio is found within the above range, it is possible to control the diameters of or gaps separating the aluminum pillar-shaped nano-structures of an aluminum silicon germanium nano-structure according to the invention better than the diameters of or gaps separating the aluminum pillar-shaped nano-structures of an aluminum silicon nano-structure or an aluminum germanium nano-structure. From this point of view, the present invention includes a method of controlling the diameters of or gaps separating the pillar-shaped members of a structure according to the invention.

An aluminum silicon germanium composite structure according to the invention comprises aluminum pillar-shaped structures containing aluminum as principal ingredient and a silicon germanium region surrounding them and containing silicon and germanium as principal ingredient.

While the pillar-shaped structure section 1 contains aluminum as principal ingredient, they may additionally contain silicon, germanium, oxygen and/or argon as other ingredients so long as a microstructure having pillar-shaped structures is obtained. The expression of principal ingredient as used herein refers to the composition of the pillar-shaped structure section where the aluminum content is not less than 50 atomic %, preferably not less than 80 atomic %.

While the silicon germanium region that surrounds the pillar-shaped structures contains silicon and germanium as principal ingredient, it may additionally contain aluminum, oxygen and/or argon as other ingredients so long as it surrounds pillar-shaped microstructures containing aluminum. The expression of principal ingredient as used herein refers to the composition of the silicon germanium region where the combined content of silicon and germanium is not less than 50 atomic %, preferably not less than 80 atomic %.

Desirably, the silicon germanium region is amorphous. From the viewpoint of insulating effect, it is desirable that the silicon germanium region is made of amorphous silicon germanium because a higher electric insulating effect of the matrix material separating the pillar-shaped structures are obtained due to a greater band gap and a higher defect density when amorphous silicon germanium is used than when crystal silicon germanium is used.

A composite structure according to the invention is in a state where aluminum is isolated in a silicon germanium matrix.

(Structure)

The pillar-shaped structures 1 that contain aluminum show a circular or elliptic plan view. Of course, they may show any other plan view so long as they are appropriately distributed in the silicon germanium region 2.

While there are no particular limitations to the diameter of the pillar-shaped structures of an aluminum silicon germanium composite structure according to the invention, the average diameter is not less than 0.5 nm and not more than 30 nm, preferably not less than 0.5 nm and not more than 20 nm, more preferably not less than 0.5 nm and not more than 15 nm. The lower limit may be 1 nm or 2 nm. The diameter as used herein refers to 2r in FIG. 1B. In the case where the pillar-shaped members show an elliptic or other plan view, it is necessary and sufficient that the greatest axes corresponding to the diameters in the case of circular plan view are found within the above defined range. The average diameter refers to the value that is obtained from the images of the pillar-shaped members of aluminum that can be observed in an SEM photograph (of an area of about 100 nm×100 nm) by processing the photograph by means of a computer. The aluminum part is assumed to show an elliptic plan view and the average value of major axes are calculated.

Meanwhile, a nano-structure having a diameter (major axis) of nanometers (in a range between about 0.1 nm and 100 nm) can show peculiar electric, optical and chemical properties when the dimensions are made smaller than a characteristic value (e.g., mean free path). Thus, a nano-structure that is used as functional material can be very useful from this viewpoint. An aluminum silicon germanium composite structure according to the invention can be utilized in various different ways as nano-structure when the pillar-shaped structures it comprises show a diameter not less than 0.5 nm and not more than 30 nm, particularly not less than 0.5 nm and not more than 15 nm.

The distance 2R between the centers of any two adjacently located pillar-shaped structures 1 (FIG. 1B) is not more than 30 nm, preferably not more than 20 nm. Of course, the distance 2R between the centers of any two adjacently located pillar-shaped structures needs to be such that the two pillar-shaped structures do not contact each other. Particularly, it is desirable that both the average diameter 2r of the pillar-shaped structures and the distance 2R between the centers of any two adjacently located pillar-shaped structures are found within the above defined respective ranges.

A typical microstructure according to the invention comprises pillar-shaped aluminum nano-structures having a diameter between 1 and 15 nm, the distance between the centers of any two adjacently located aluminum nano-structures being between 10 and 20 nm, the ratio of the height to the diameter of the aluminum nano-structures being between 0.1 and 100,000, the aluminum nano-structures being arranged perpendicularly relative to the substrate.

As illustrated in FIG. 1B, the pillar-shaped structures 1 may show a rectangular cross sectional view taken through the substrate. Alternatively, they may show a square or trapezoidal cross sectional view. The pillar-shaped structures may show a profile with an appropriate aspect ratio (length/diameter). The aspect ratio (length L/diameter 2r) may be between 0.1 and 100,000.

For example, the length L of the pillar-shaped structures may be between 1 nm and 100 μm.

Particularly, assuming that the diameter 2r of the pillar-shaped structures is between 1 and 15 nm and the distance 2R between the centers of any two adjacently located pillar-shaped structures is between 10 and 20 nm, the length L can be controlled so as to be between 1 nm and several μm in a manner as described below. The pillar-shaped structures 1 operate as aluminum quantum dots (zero-dimensional) when the length L is between several nm and tens of several nm (and hence the ratio of the length to the diameter is small), whereas they operate as aluminum quantum wires (one-dimensional) when the length L is greater.

As shown in FIG. 1B, the pillar-shaped structures 1 that contain aluminum are separated from each other by the silicon germanium region that contains silicon and germanium as principal ingredient. In other words, a number of pillar-shaped structures are distributed in the silicon germanium region.

Preferably, the pillar-shaped structures 1 that contain aluminum are arranged in a specific direction. Particularly, they are arranged in a direction perpendicular to the substrate as shown in FIG. 1B.

While the substrate 3 is not subjected to particular limitations, it may be selected from insulator substrates such as quartz glass substrates and plastic substrates, semiconductor substrates including silicon substrates, germanium substrates, gallium arsenide substrates and indium phosphide substrates and flexible substrates (e.g., polyimide resin substrates) provided that the substrate operates as support member and an aluminum silicon germanium structure according to the invention can be formed on it. Substrates on which one or more than one film layers formed may also be used.

Embodiment 6

Method of Preparing an Aluminum Silicon Germanium Composite Structure

Now, a method of preparing an aluminum silicon germanium composite structure according to the invention will be described by also referring to FIG. 2. More specifically, a sputtering method is used for preparing an aluminum silicon germanium composite structure as exemplary method for forming a film in a non-equilibrium state in the following description. In FIG. 2, reference symbols 11 and 12 respectively denote a substrate and a sputtering target. The ratio of the contents of aluminum, silicon and germanium can be easily modified by regulating the target materials when a sputtering method is used. In this embodiment, reference symbol 13 denotes silicon chips or germanium chips.

As shown in FIG. 2, an aluminum silicon germanium composite film is formed on a substrate by means of a magnetron sputtering method that is a method for forming a film in a non-equilibrium state.

Raw materials of silicon, germanium and aluminum are provided properly by arranging silicon chips and germanium chips on an aluminum target substrate as shown in FIG. 2. While a number of silicon chips and germanium chips are arranged on the aluminum target substrate in FIG. 2, the arrangement of silicon or germanium chips is not limited to it. Only a single silicon chip or germanium chip may alternatively be arranged on the aluminum target substrate so long as a desired film is formed. Note however, silicon chips and germanium chips are preferably arranged symmetrically on the substrate 11 if aluminum-containing pillar-shaped structures are to be uniformly distributed in a silicon germanium region.

It is also possible to use aluminum silicon germanium sintered body prepared by baking a predetermined amount of powder of aluminum, silicon and germanium as target for forming a film. A homogeneous film that is practically free from variances of film composition can be obtained by using such a target.

Similarly, it is also possible to perform a sputtering process simultaneously on an aluminum target, a silicon target and a germanium target that are prepared separately.

The combined content of silicon and germanium of the film that is produced by sputtering is not less than 20 atomic % and not more than 70 atomic %, preferably not less than 25 atomic % and not more than 65 atomic %, more preferably not less than 30 atomic % and not more than 60 atomic % relative to the total amount of aluminum, silicon and germanium.

The substrate temperature is not higher than 300° C., preferably not higher than 200° C., more preferably not lower than 100° C. and not higher than 150° C. The lower limit is 0° C. or room temperature. If the content of silicon and germanium is found within the above defined range, an aluminum silicon germanium composite structure comprising pillar-shaped structures distributed in a silicon germanium region is obtained at substrate temperature within the above range.

The temperature of the specimen of aluminum silicon germanium composite film being formed is typically not higher than 300° C., preferably not higher than 200° C. When a composite film of aluminum, silicon and germanium is formed by means of a method of forming a film of substances in a non-equilibrium state at specimen temperature not higher than 300° C. though depending on film forming conditions, the prepared aluminum silicon germanium composite film shows an eutectic composition where aluminum, silicon and germanium are in a metastable state and aluminum forms pillar-shaped nano-structures of dimensions of several nm and becomes separated from the silicon germanium region in a self-forming manner.

The combined content of silicon and germanium in an aluminum silicon germanium composite structure according to the invention can be controlled typically by arranging an appropriate amount of silicon chips or germanium chips on an aluminum target or by using a target prepared by using an appropriate mixing ratio of aluminum, silicon and germanium in a powdery state.

When a film is formed in a non-equilibrium state particularly by sputtering, the pressure in the reactor in which argon gas is made to flow is preferably between 0.2 and 1 Pa or between 0.1 and 1 Pa, although the pressure is by no means limited to the above range so long as argon plasma is produced on a stable basis under that pressure.

The substrate 11 may be selected from insulator substrates such as quartz glass substrates, semiconductor substrates including silicon substrates and gallium arsenide substrates and substrates on which one or more than one film layers are formed. The material, the thickness and the mechanical strength of the substrate are not subjected to any particular limitations so long as it does not provide any problem for forming an aluminum pillar-shaped nano-structure. The profile of the substrate is not limited to that of a smooth and flat plate. In other words, the surface of the substrate may be curved or have undulations or steps to a certain extent. Thus, there are no particular limitations to the profile of the substrate so long as a desired aluminum pillar-shaped nano-structure is formed properly.

The method of forming a film of substances in a non-equilibrium state to be used for this embodiment is preferably a sputtering method, although some other appropriate method of forming a film of substances in a non-equilibrium state may be used. More specifically, an evaporation method (resistance heating evaporation, electron beam evaporation, etc.), an ion plating method or some other method that can form a film of substances in a non-equilibrium state may be used for this embodiment.

For forming a film, a simultaneous film forming process of forming a film of silicon, germanium and aluminum at the same time may be used. Alternatively, a multilayer film forming process of successively forming several atomic layers of silicon, those of germanium and those of aluminum may be used.

Embodiment 7

Device Comprising an Aluminum Silicon Germanium Composite Structure

Figure 9:
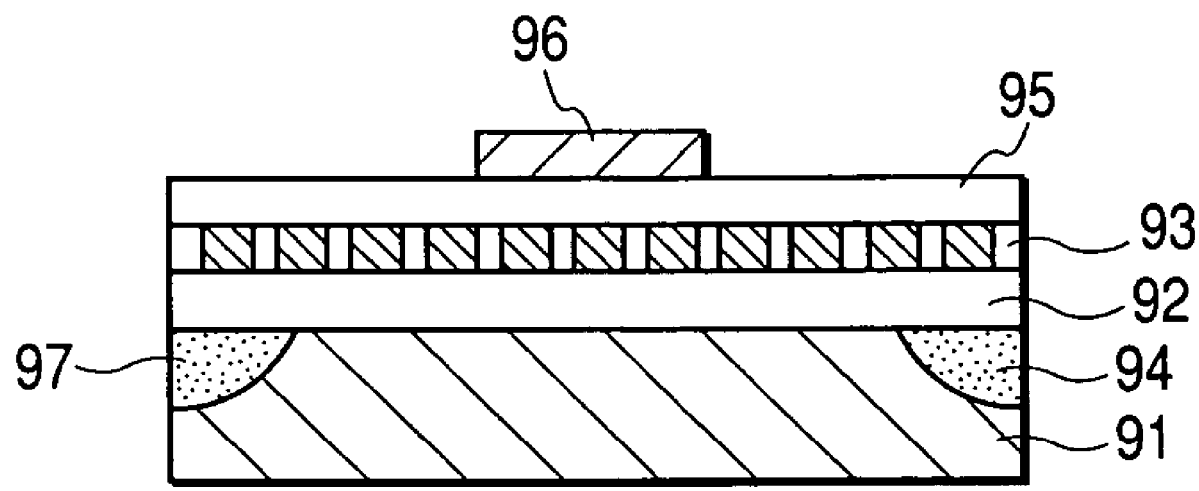
FIG. 9 is a schematic cross sectional view of a single-electron memory realized by using a structure according to the invention.

FIG. 9 is a schematic cross sectional view of a single-electron memory realized by using an aluminum silicon germanium composite structure according to the invention.

In FIG. 9, there are shown a substrate 91, an insulating body (e.g., silicon oxide body) 92, a structure 93 in which pillar-shaped members of aluminum are distributed in a mixture of silicon and germanium (aluminum silicon germanium composite structure), a drain region 94, a gate insulating region 95, a gate electrode 96 and a source region 97.

As aluminum is used as quantum dots as shown in FIG. 9, the electric characteristics of the channel part can be controlled by using the influence of the electric charge accumulated in the quantum dots. Additionally, an electric charge can be accumulated in quantum dots for a long time, a nonvolatile memory from which the stored information is not lost after turning off the power supply can be formed by using such quantum dots. While an aluminum silicon germanium structure is used in the above description, other materials may be used so long as a structure comprising distributed pillar-shaped members can be obtained (e.g., aluminum silicon may be used in place of aluminum silicon germanium).

A single-electron memory that utilizes the quantum effect, or a single-electron transistor utilizing a similar principle can be formed by using an aluminum silicon germanium structure prepared in a manner as described above.

According to the invention, aluminum pillar-shaped nano-structures such as quantum dots or quantum wires can be utilized in various different ways to remarkably broaden the scope of utilization of such structures.

EXAMPLE 1

First Material Al, Second Material Si

Figure 3:
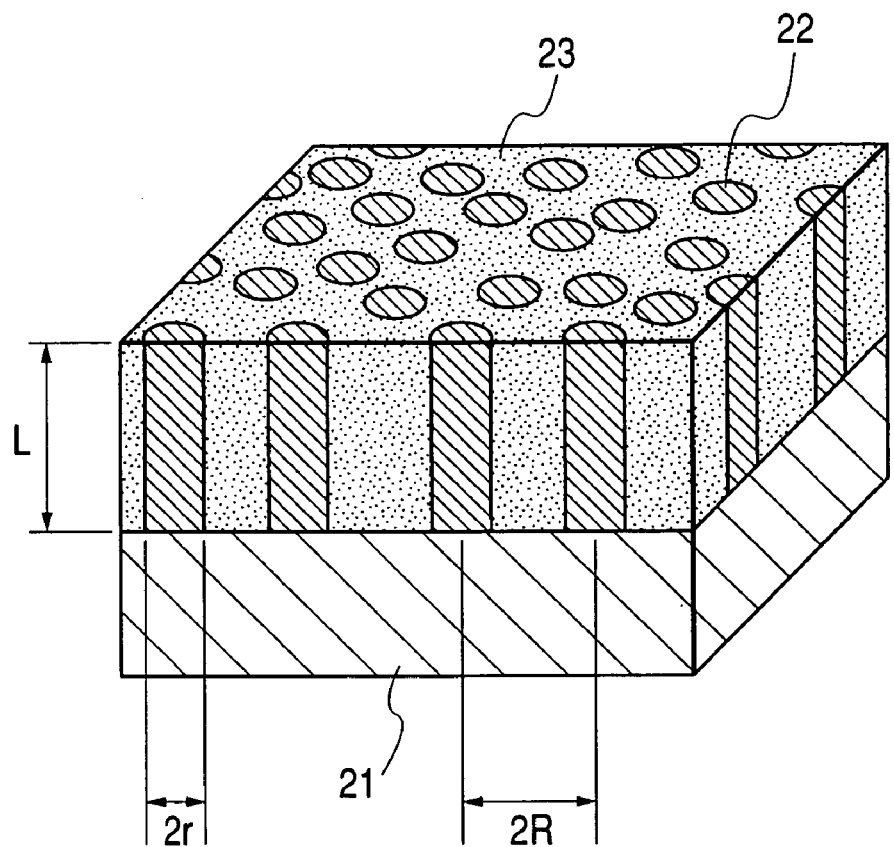
FIG. 3 is a schematic perspective view of another embodiment of structure according to the invention.

FIG. 3 is a schematic perspective view of an aluminum silicon structure according to the invention. In FIG. 3, the pillar-shaped members surrounded by silicon are aluminum structures, or aluminum wires having a diameter 2r of 3 nm and a length L of 200 nm. Any two adjacently located pillar-shaped members are separated by a gap 2R of 7 nm.

Figure 6:
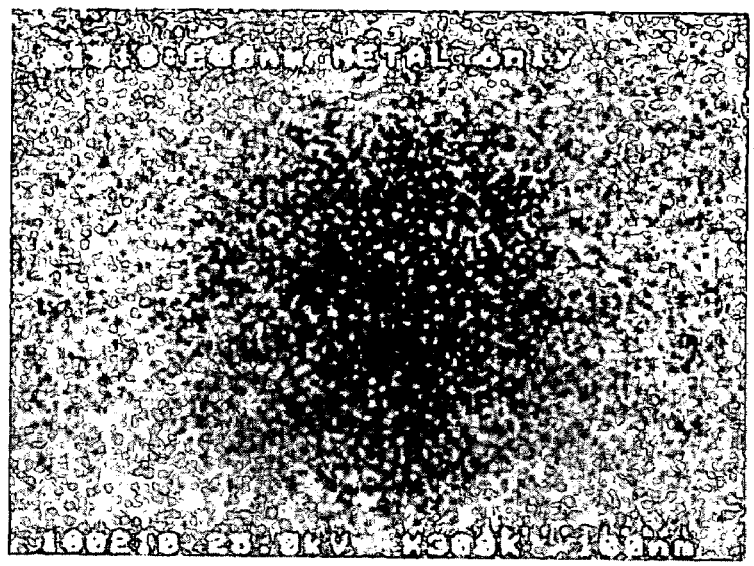
FIG. 6 is an FE-SEM image of an embodiment of aluminum silicon composite structure according to the invention.

In FIG. 3, reference symbols 21, 22 and 23 respectively denote a substrate, an aluminum quantum wire and silicon. An actual SEM image is shown in FIG. 6.

Firstly, the process used for preparing the aluminum wires will be described below.

An aluminum silicon composite film containing silicon by 55 atomic % relative to the total amount of silicon and aluminum was formed to a thickness of 200 nm on a glass substrate 21 by means of RF magnetron sputtering. A total of eight 15 mm square silicon chips 13 were placed on a 4-inch aluminum target as shown in FIG. 2 and used as so many targets. The sputtering operation was conducted by using an RF power source under sputtering conditions of Ar gas flow rate: 50 sccm, discharge pressure: 0.7 Pa and applied power: 1 kW. The substrate was held to room temperature.

While eight silicon chips 13 were placed on an aluminum target and used as so many targets 12 in this example, the number of silicon chips is by no means limited thereto and any other number of silicon chips may be used so long as the obtained aluminum silicon composite film contains silicon by about 55 atomic %. Additionally, it is not necessary to place targets of silicon chips on an aluminum target. Inversely, aluminum chips may be placed on a silicon target. Alternatively, targets prepared by baking powder of aluminum and silicon may be used.

Thereafter, the obtained aluminum silicon composite film was analyzed by means of ICP (inductively coupled plasma atomic emission spectrometry) in order to determine the amount of silicon relative to the total amount of aluminum and silicon (in terms of atomic %). As a result, it was found that the amount of silicon relative to the total amount of aluminum and silicon was about 55 atomic %. For the convenience of analysis, a carbon substrate was used and the aluminum silicon composite film was formed on the carbon substrate.

Then, the aluminum silicon composite film was observed through an FE-SEM (field emission scanning electron microscope). When observed from a position right above the substrate, the surface of the specimen showed circular plan views of aluminum nano-structures that were arranged two-dimensionally and surrounded by silicon. The circular plan views of the aluminum nano-structures had a diameter of 3 nm and the centers of any two adjacently located ones are separated by 7 nm on the average. When the specimen was observed through the FE-SEM along a cross section taken through the substrate, the aluminum nano-structures showed a height of 200 nm. It was found that the aluminum nano-structures were independent from each other.

When the specimen was observed by means of X-ray diffractometry, no silicon peak that reveals crystallinity was observed to prove that the silicon was amorphous. Some aluminum peaks, on the other hand, were observed to prove that the aluminum was at least partly polycrystalline.

Thus, it was possible to prepare an aluminum silicon nano-structure comprising aluminum wires having a diameter 2r of 3 nm and a length L of 200 nm and surrounded by silicon in such a way that any two adjacently located aluminum wires were separated from each other by a gap 2R of 7 nm.

As described above for the example, it is possible to form an aluminum silicon nano-structure comprising aluminum nano-structures, which may be aluminum quantum dots or aluminum quantum wires of dimensions of several nm, in the silicon matrix on the surface of a substrate by means of a film forming method such as a sputtering method that is adapted to form a film of substances in a non-equilibrium state.

EXAMPLE FOR COMPARISON

An aluminum silicon composite film containing silicon by 15 atomic % relative to the total amount of silicon and aluminum was formed to a thickness of about 200 nm on a glass substrate by means of sputtering to prepare Specimen A for comparison. A pair of 15 mm square silicon chips 13 were placed on a 4-inch aluminum target and used as so many targets. The sputtering operation was conducted by using an RF power source under sputtering conditions of Ar gas flow rate: 50 sccm, discharge pressure: 0.7 Pa and applied power: 1 kW. The substrate was held to room temperature.

Figure 7:
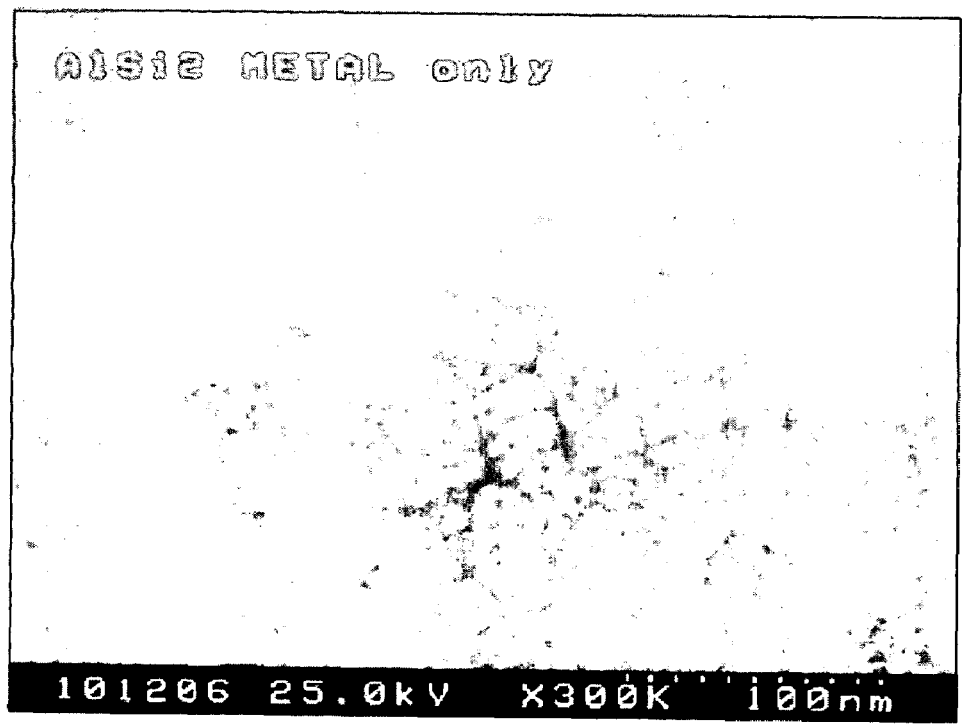
FIG. 7 is an FE-SEM image of another embodiment of aluminum silicon composite structure according to the invention.

Thereafter, the obtained Specimen A for comparison was observed through an FE-SEM (field emission scanning electron microscope). See FIG. 7. When observed from a position right above the substrate, the surface of the specimen did not show circular plan views of aluminum nano-structures. They showed plan views of aluminum connected continuously. In other words, the specimen was not a microstructure comprising pillar-shaped aluminum structures uniformly distributed in a silicon region. Their sizes by far exceeded 10 nm. When the specimen was observed through the FE-SEM along a cross section taken through the substrate, the aluminum portions showed a width exceeding 15 nm. The obtained aluminum silicon composite film was analyzed by means of ICP (inductively coupled plasma atomic emission spectrometry) in order to determine the amount of silicon relative to the total amount of aluminum and silicon (in terms of atomic %). As a result, it was found that the amount of silicon relative to the total amount of aluminum and silicon was about 15 atomic %.

Another aluminum silicon composite film containing silicon by 75 atomic % relative to the total amount of silicon and aluminum was formed to a thickness of about 200 nm on a glass substrate by means of sputtering to prepare Specimen B for comparison. A total of fourteen 15 mm square silicon chips 13 were placed on a 4-inch aluminum target and used as so many targets. The sputtering operation was conducted by using an RF power source under sputtering conditions of Ar gas flow rate: 50 sccm, discharge pressure: 0.7 Pa and applied power: 1 kW. The substrate was held to room temperature.

Thereafter, the obtained Specimen B for comparison was observed through an FE-SEM (field emission scanning electron microscope). When observed from a position right above the substrate, no aluminum parts were found. No aluminum parts were found either when the specimen was observed through the FE-SEM along a cross section taken through the substrate. The obtained aluminum silicon composite film was analyzed by means of ICP (inductively coupled plasma atomic emission spectrometry) in order to determine the amount of silicon relative to the total amount of aluminum and silicon (in terms of atomic %). As a result, it was found that the amount of silicon relative to the total amount of aluminum and silicon was about 75 atomic %.

Still eight other specimens were prepared for comparison under the conditions same as those used for preparing the Specimen A for comparison except that the number of silicon chips was changed. The prepared specimens contained silicon respectively by 20 atomic %, 25 atomic %, 35 atomic %, 50 atomic %, 55 atomic %, 60 atomic %, 65 atomic % and 70 atomic %. Table 1 below shows those having a microstructure where pillar-shaped aluminum structures were distributed in a silicon region (formed) and those having no such a microstructure (not formed). Preferable range of silicon content is not less than 30 atomic % and not more than 60 atomic % from the viewpoint of uniformity of pillar-shaped structures. The specimens with a silicon content of 65 or 70 atomic % showed a lower crystallinity of aluminum, close to amorphous.

TABLE 1

| silicon content (atomic %) | microstructure |
|---|---|
| 15 | not formed |
| (Specimen A for comparison) | |
| 20 | formed |
| 25 | formed |
| 35 | formed |
| 50 | formed |
| 55 | formed |
| 60 | formed |
| 65 | Formed |
| 70 | Formed |
| 75 | not formed |
| (Specimen B for comparison) | |

Thus, structures comprising aluminum pillar-shaped structures distributed in a silicon region can be realized by regulating the content of silicon to not less than 20 atomic % and not more than 70 atomic % relative to the total amount of aluminum and silicon. Further, the diameter (major axis) of the aluminum nano-structures of the microstructure to be prepared can be controlled by regulating the content ratio of aluminum to silicon. Then, it is also possible to obtain highly linear aluminum wires. A TEM (transmission electron microscope) may be used in place of an SEM to observe the structures.

Still another aluminum silicon composite film containing silicon by 55 atomic % relative to the total amount of silicon and aluminum was formed to a thickness of about 200 nm on a glass substrate by means of sputtering to prepare Specimen C for comparison. A total of eight 15 mm square silicon chips 13 were placed on a 4-inch aluminum target and used as so many targets. The sputtering operation was conducted by using an RF power source under sputtering conditions of Ar gas flow rate: 50 sccm, discharge pressure: 0.7 Pa and applied power: 1 kW. The substrate was held to 350° C.

Thereafter, the obtained Specimen C for comparison was observed through an FE-SEM (field emission scanning electron microscope). When observed from a position right above the substrate, a large lump of aluminum was found. Further, in a X-ray diffraction measurement, crystallization of silicon was noted. In other words, no visible aluminum nano-structures were found and the silicon region was not amorphous but crystallized. The inventors presume that a transition to a more stable state occurs when the temperature of the substrate is too high so that no film growth takes forming aluminum nano-structure place.

It is also preferable to use a target composition of Al:Si=55:45 for obtaining a structure where pillar-shaped members are uniformly distributed.

EXAMPLE 2

Figure 4:
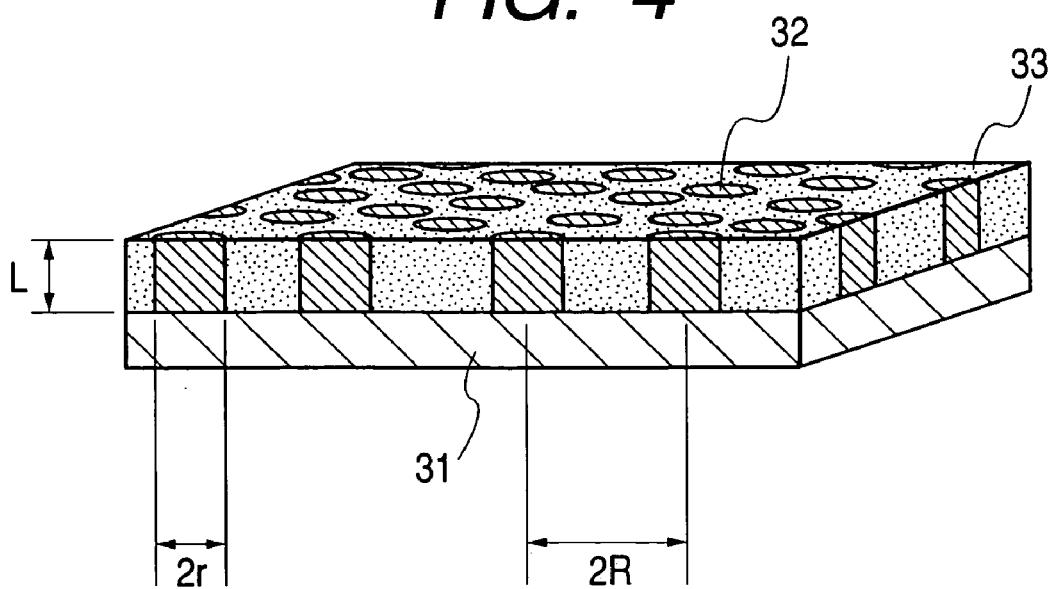
FIG. 4 is a schematic perspective view of still another embodiment of structure according to the invention.

FIG. 4 is a schematic perspective view of still another aluminum silicon nano-structure according to the invention. The illustrated aluminum nano-structure parts are pillar-shaped and surrounded by silicon. They are aluminum quantum dots having a diameter 2r of 6 nm and a length L of 10 nm, any two adjacently located ones of the aluminum quantum dots being separated by a gap 2R of 9 nm. In FIG. 4, reference symbols 31, 32 and 33 respectively denote a substrate, an aluminum quantum dot and silicon. Firstly, the method used in this example for preparing an aluminum silicon nano-structure having aluminum nano-structure parts that were aluminum quantum dots will be described. An aluminum silicon composite film containing silicon by 30 atomic % relative to the total amount of silicon and aluminum was formed to a thickness of about 10 nm on a silicon substrate by means of an electron beam evaporation method that is a physical evaporation method. More specifically, a crucible of silicon and that of aluminum were used simultaneously for electron beam evaporation.

Thereafter, the obtained aluminum silicon composite film was analyzed by means of ICP (inductively coupled plasma atomic emission spectrometry) in order to determine the amount of silicon relative to the total amount of aluminum and silicon (in terms of atomic %). As a result, it was found that the amount of silicon relative to the total amount of aluminum and silicon was about 30 atomic %. For the convenience of analysis, a carbon substrate was used and the aluminum silicon composite film was formed on the carbon substrate.

Then, the aluminum silicon composite film was observed through an FE-SEM (field emission scanning electron microscope). When observed from a position right above the substrate, the surface of the specimen showed circular plan views of aluminum quantum dots that were arranged two-dimensionally and surrounded by silicon as shown in FIG. 4. The circular plan views of the aluminum nano-structures (aluminum quantum dots) had a diameter 2r of 6 nm and the centers of any two adjacently located ones are separated by a gap 2R of 9 nm on the average. When the specimen was observed through the FE-SEM along a cross section taken through the substrate, the aluminum nano-structures showed a height of 10 nm. It was found that the aluminum quantum dots were independent from each other.

Thus, it was possible to prepare an aluminum silicon nano-structure comprising aluminum quantum dots having a diameter 2r of 6 nm and a height L of 10 nm and surrounded by silicon in such a way that any two adjacently located aluminum dots were separated from each other by a gap 2R of 9 nm. When the specimen was observed by means of X-ray diffractometry, it was found that the aluminum was crystalline and the silicon was amorphous.

EXAMPLE 3

Figure 10:
FIG. 10 is an FE-SEM image of a composite structure according to the invention.

In this example, a specimen was prepared by using aluminum as first and silicon and germanium as second material. This example will be described by referring also to FIG. 3. FIG. 3 is a schematic perspective view of an aluminum silicon germanium composite structure comprising aluminum nano-structures having a pillar-shaped profile with a diameter 2r of 7 nm and a length L of 200 nm and surrounded by silicon germanium, the gap 2R separating any two adjacently located aluminum nano-structures being 10 nm. In FIG. 3, reference symbols 21, 22 and 23 respectively denote a substrate, an aluminum quantum wire (a pillar-shaped structure formed to contain aluminum) and an amorphous silicon germanium region. An SEM image is shown in FIG. 10.

Firstly, the process used for preparing the aluminum wires will be described below.

An aluminum silicon germanium composite film, whose content of silicon and germanium was 38 atomic % relative to the total amount of aluminum, silicon and germanium, was formed to a thickness of about 200 nm on a glass substrate 21 by means of RF magnetron sputtering. A pair of 15 mm square silicon chips and a pair of 15 mm square germanium chips were placed on a 4-inch aluminum target as shown in FIG. 2 and used as so many targets. The sputtering operation was conducted by using an RF power source under sputtering conditions of Ar gas flow rate: 50 sccm, discharge pressure: 0.7 Pa and applied power: 300 W. The substrate was held to room temperature.

While four chips 13 including silicon chips and germanium chips were placed on an aluminum target and used as so many targets in this example, the number of silicon and germanium chips is by no means limited thereto and any other number of silicon and germanium chips may be used so long as the obtained aluminum silicon germanium composite film contains silicon and germanium by about 38 atomic % relative to the total amount of aluminum, silicon and germanium. Additionally, it is not necessary to place targets of silicon and germanium chips on an aluminum target. Alternatively, aluminum chips and germanium chips may be placed on a silicon target. Still alternatively, targets prepared by sintering powder of silicon, germanium and aluminum may be used.

While an RF sputtering method was used for the sputtering process in this example, methods that can be used for the sputtering process is not limited thereto. An ECR sputtering method, a DC-sputtering method or an ion beam sputtering method may alternatively be used. The sputtering conditions are dependent on the sputtering system that is used for the sputtering process and therefore they are not limited to those listed above.

Thereafter, the obtained aluminum silicon germanium composite film was analyzed by means of ICP (inductively coupled plasma atomic emission spectrometry) in order to determine the combined content of silicon and germanium relative to the total amount of aluminum, silicon and germanium (in terms of atomic %). As a result, it was found that the combined content of silicon and germanium relative to the total amount of aluminum, silicon and germanium was about 38 atomic %.

For the convenience of analysis, a carbon substrate was used and the aluminum silicon germanium composite film was formed on the carbon substrate.

Then, the aluminum silicon germanium composite film was observed through an FE-SEM (field emission scanning electron microscope). When observed from a position right above the substrate, the surface of the specimen showed circular plan views of aluminum nano-structures that were arranged two-dimensionally and surrounded by a mixture of silicon and germanium. The circular plan views of the aluminum nano-structures had a diameter of 7 nm and the centers of any two adjacently located ones are separated by 10 nm on the average as determined by processing the image of the aluminum nano-structures. When the specimen was observed through the FE-SEM along a cross section taken through the substrate, the aluminum nano-structures showed a height of 200 nm. It was found that the aluminum nano-structures were independent from each other.

When the specimen was observed by means of X-ray diffractometry, no silicon and germanium peaks that reveal crystallinity were observed to prove that the mixture of silicon and germanium was amorphous. On the other hand, aluminum peaks were observed to prove that aluminum was polycrystalline.

Thus, it was possible to prepare an aluminum silicon germanium composite structure comprising aluminum wires having a diameter $2r$ of 7 nm and a length L of 200 nm and surrounded by a mixture of silicon and germanium in such a way that any two adjacently located aluminum wires were separated from each other by a gap $2R$ of 10 nm.

As described above for the example, it is possible to two-dimensionally form an aluminum silicon germanium composite structure comprising aluminum nano-structures, which may be aluminum quantum dots or aluminum quantum wires of dimensions of several nm to tens of several nm, on the surface of a substrate by means of a film forming method such as a sputtering method that is adapted to form a film of substances in a non-equilibrium state.

EXAMPLE FOR COMPARISON

An aluminum silicon germanium composite film, whose content of silicon and germanium was 15 atomic % relative to the total amount of aluminum, silicon and germanium, was formed to a thickness of about 200 nm on a glass substrate by means of sputtering to prepare Specimen D for comparison. A 15 mm square silicon chip and a 15 mm square germanium chip were placed on a 4-inch aluminum target and used as so many targets. The sputtering operation was conducted by using an RF power source under sputtering conditions of Ar gas flow rate: 50 sccm, discharge pressure: 0.7 Pa and applied power: 300 W. The substrate was held to room temperature.

Thereafter, the obtained Specimen D for comparison was observed through an FE-SEM (field emission scanning electron microscope). When observed from a position right above the substrate, the surface of the specimen did not show circular plan views of aluminum nano-structures. The aluminum parts showed plan views that were connected continuously. In other words, the specimen was not a microstructure comprising pillar-shaped aluminum structures uniformly distributed in a silicon germanium region. Their sizes (lengths) by far exceeded 20 nm. When the specimen was observed through the FE-SEM along a cross section taken through the substrate, the aluminum parts were not pillar-shaped but formed a lump with a size exceeding tens of several nm. The obtained aluminum silicon germanium composite film was analyzed by means of ICP (inductively coupled plasma atomic emission spectrometry) in order to determine the combined content of silicon and germanium relative to the total amount of aluminum, silicon and germanium (in terms of atomic %). As a result, it was found that the amount of silicon and germanium relative to the total amount of aluminum, silicon and germanium was about 15 atomic %.

Another aluminum silicon germanium composite film, whose content of silicon and germanium was 75 atomic % relative to the total amount of aluminum, silicon and germanium, was formed to a thickness of about 200 nm on a glass substrate by means of sputtering to prepare Specimen E for comparison. Five 15 mm square silicon chips and five 15 mm square germanium chips were placed on a 4-inch aluminum target and used as so many targets. The sputtering operation was conducted by using an RF power source under sputtering conditions of Ar gas flow rate: 50 sccm, discharge pressure: 0.7 Pa and applied power: 300 W. The substrate was held to room temperature.

Thereafter, the obtained Specimen E for comparison was observed through an FE-SEM (field emission scanning electron microscope). When observed from a position right above the substrate, no aluminum parts were found. No distinct aluminum parts were found either when the specimen was observed through the FE-SEM along a cross section taken through the substrate. The obtained aluminum silicon germanium composite film was analyzed by means of ICP (inductively coupled plasma atomic emission spectrometry) in order to determine the combined content of silicon and germanium relative to the total amount of aluminum, silicon and germanium (in terms of atomic %). As a result, it was found that the amount of silicon and germanium relative to the total amount of aluminum, silicon and germanium (or 100 atomic %) was about 75 atomic %.

Thus, it is possible to form aluminum nano-structures in silicon germanium by regulating the content of silicon and germanium to not less than 20 atomic % and not more than 70 atomic % relative to the total amount of aluminum, silicon and germanium. Then, it is also possible to obtain highly linear aluminum wires.

Another aluminum silicon germanium composite film, whose content of silicon and germanium was 38 atomic % relative to the total amount of aluminum, silicon and germanium, was formed to a thickness of about 200 nm on a glass substrate by means of sputtering to prepare Specimen F for comparison. A pair of 15 mm square silicon chips and a pair of 15 mm square germanium chips were placed on a 4-inch aluminum target and used as so many targets. The sputtering operation was conducted by using an RF power source under sputtering conditions of Ar gas flow rate: 50 sccm, discharge pressure: 0.7 Pa and applied power: 300 W. The substrate was held to 350° C.

Thereafter, the obtained Specimen F for comparison was observed through an FE-SEM (field emission scanning electron microscope). When observed from a position right above the substrate, no circular or elliptic aluminum areas were found. In other words, no visible aluminum nano-structures were found. The inventors presume that a transition to a more stable state occurs when the temperature of the substrate is too high so that no film growth forming pillar-shaped aluminum nano-structures as shown in FIGS. 1A and 1B or in FIG. 3 takes place.

EXAMPLE 4

In this example, a specimen of aluminum silicon germanium composite structure was prepared. This specimen will be described by referring also to FIG. 4. The illustrated aluminum nano-structure parts are pillar-shaped and surrounded by silicon germanium. They are aluminum quantum dots having a diameter $2r$ of 6 nm and a length L of 10 nm, any two adjacently located ones of the aluminum quantum dots being separated by a gap $2R$ of 8 nm. In FIG. 4, reference symbols 31, 32 and 33 respectively denote a substrate, an aluminum quantum dot and an amorphous silicon germanium region. Firstly, the method used in this example for preparing an aluminum silicon germanium composite structure having pillar-shaped aluminum nano-structure parts that were aluminum quantum dots will be described. An aluminum silicon germanium composite film containing silicon and germanium by 33 atomic % relative to the total amount of aluminum, silicon and germanium was formed to a thickness of about 10 nm on a silicon substrate by means of a magnetron sputtering method.

Thereafter, the obtained aluminum silicon germanium composite film was analyzed by means of ICP (inductively coupled plasma atomic emission spectrometry) in order to determine the combined content of silicon and germanium relative to the total amount of aluminum, silicon and germanium (in terms of atomic %). As a result, it was found that the content of silicon and germanium relative to the total amount of aluminum, silicon and germanium was about 33 atomic %. For the convenience of analysis, a carbon substrate was used and the aluminum silicon germanium composite film was formed on the carbon substrate.

Then, the aluminum silicon germanium composite film was observed through an FE-SEM (field emission scanning electron microscope). When observed from a position obliquely above the substrate, the surface of the specimen showed circular plan views of aluminum quantum dots that were arranged two-dimensionally and surrounded by silicon germanium as shown in FIG. 4. The circular plan views of the aluminum quantum dots had a diameter $2r$ of 6 nm and the centers of any two adjacently located ones are separated by a gap $2R$ of 8 nm. When the specimen was observed through the FE-SEM along a cross section taken through the substrate, the aluminum quantum dots showed a height of 10 nm. It was found that the aluminum quantum dots-were independent from each other.

Thus, it was possible to prepare an aluminum silicon germanium composite structure comprising aluminum quantum dots having a diameter $2r$ of 6 nm and a height L of 10 nm and surrounded by silicon germanium in such a way that any two adjacently located aluminum quantum dots were separated from each other by a gap $2R$ of 8 nm. When the specimen was observed by means of X-ray diffractometry, it was found that the aluminum was crystalline and the silicon germanium was amorphous.

The diameter (major axis) of the aluminum nano-structures and the gap separating any two adjacently located aluminum nano-structures can be regulated by changing the content of silicon and germanium relative to the total amount of aluminum, silicon and germanium of an aluminum silicon germanium composite structure (typically, the diameter (major axis) of the aluminum nano-structures is increased by reducing the content of silicon and germanium). The height of the aluminum nano-structures of an aluminum silicon germanium composite structure can be regulated by changing the film thickness of the latter.

Further, the diameter of or gaps separating the pillar-shaped aluminum structures can be regulated by changing the content ratio of germanium to silicon in the aluminum silicon germanium composite structure.

As described in detail, the present invention provides a structure comprising pillar-shaped members distributed in a surrounding region, a method of manufacturing such a structure and a device realized by using such a structure.

What is claimed is:

1. A structure containing a first material and a second material, said structure comprising pillar-shaped members containing the first material and a region containing the second material surrounding the pillar-shaped members, provided that the second material is not composed of only germanium, and that the structure containing the second material is at a content not less than 20 atomic % and not more than 70 atomic % relative to the total amount of the first and second materials, wherein said first material is aluminum.

2. A structure containing a first material and a second material, said structure comprising pillar-shaped members containing the first material and a region containing the second material surrounding the pillar-shaped members, provided that the second material is not composed of only germanium, and that the structure containing the second material is at a content not less than 20 atomic % and not more than 70 atomic % relative to the total amount of the first and second materials, wherein said second material is silicon or a mixture of silicon and germanium.

3. A structure containing a first material and a second material, said structure comprising pillar-shaped members containing the first material and a region containing the second material surrounding the pillar-shaped members, provided that the second material is not composed of only germanium, and that the structure containing the second material is at a content not less than 20 atomic % and not more than 70 atomic % relative to the total amount of the first and second materials, wherein said structure contains said second material at a content not less than 30 atomic % and not more than 60 atomic %.

4. The structure according to claim 3, wherein the average diameter of said pillar-shaped members is not more than 50 nm.

5. The structure according to claim 3, wherein the distance between the centers of any two adjacently located ones of said pillar-shaped members contained in said structure is not more than 30 nm.

6. A device comprising a structure according to claim 3.

7. A film-shaped aluminum silicon composite structure, comprising pillar-shaped structures containing aluminum and a silicon region surrounding the pillar-shaped structures, the composite structure containing silicon at a content not less than 20 atomic % and not more than 70 atomic %.

8. The composite structure according to claim 7, wherein the content of silicon in said composite structure is not less than 25 atomic % and not more than 65 atomic %.

9. The composite structure according to claim 8, wherein the content of silicon in said composite structure is not less than 30 atomic % and not more than 60 atomic %.

10. The composite structure according to any of claims 7 claims 9, wherein the diameters of said pillar-shaped structures are not less than 0.5 nm and not more than 50 nm.

11. The composite structure according to claim 10, wherein the diameters of said pillar-shaped structures are not less than 0.5 nm and not more than 10 nm.

12. The composite structure according to any of claims 7 through 9, wherein the distance between the centers of any two adjacently located ones of said pillar-shaped structures is not more than 30 nm.

13. The composite structure according to claim 12, wherein the distance between the centers of any two adjacently located ones of said pillar-shaped structures is not more than 15 nm.

14. The composite structure according to any of claims 7 claims 9, wherein said silicon region contains amorphous silicon as principal ingredient.

15. The composite structure according to claim 14, wherein said composite structure is formed on an insulator.

16. An electronic device comprising an aluminum silicon composite structure according to claim 7.

17. A film-shaped aluminum silicon germanium composite structure, comprising pillar-shaped structures containing aluminum and a silicon germanium region surrounding the pillar-shaped structures, the composite structure containing silicon and germanium at a combined content not less than 20 atomic % and not more than 70 atomic %.

18. The composite structure according to claim 17, wherein the combined content of silicon and germanium in said composite structure is not less than 25 atomic % and not more than 65 atomic %.

19. The composite structure according to claim 18, wherein the combined content of silicon and germanium in said composite structure is not less than 30 atomic % and not more than 60 atomic %.

20. The composite structure according to any of claims 17 through 19, wherein the diameters of said pillar-shaped structures are not less than 0.5 nm and not more than 30 nm.

21. The composite structure according to claim 20, wherein the diameters of said pillar-shaped structures are not less than 0.5 nm and not more than 15 nm.

22. The composite structure according to any of claims 17 through 19, wherein the distance between the centers of any two adjacently located ones of said pillar-shaped structures is not more than 30 nm.

23. The composite structure according to claim 22, wherein the distance between the centers of any two adjacently located ones of said pillar-shaped structures is not more than 20 nm.

24. The composite structure according to any of claims 17 through 19, wherein said silicon germanium region contains amorphous silicon germanium as principal ingredient.

25. The composite structure according to any of claims 17 through 19, wherein if the content ratio of silicon to germanium in said silicon germanium region is expressed as composition $Si_xGe_{1-x}$ where Si represents silicon and Ge represents germanium, x is within the range of $0<x<1$.

26. The composite structure according to claim 24, wherein said composite structure is formed on an insulator.

27. An electronic device comprising an aluminum silicon germanium composite structure according to claim 17.

* * * * *

UNITED STATES PATENT AND TRADEMARK OFFICE
CERTIFICATE OF CORRECTION

PATENT NO. : 7,282,268 B2
APPLICATION NO. : 10/912206
DATED : October 16, 2007
INVENTOR(S) : Kazuhiko Fukutani et al.

It is certified that error appears in the above-identified patent and that said Letters Patent is hereby corrected as shown below:

<u>COLUMN 1</u>:

Line 18, "in resent" should read --in recent--; and
Line 63, "is typically" should read --are typically--.

<u>COLUMN 2</u>:

Line 53, "to-the" should read --to the--.

<u>COLUMN 4</u>:

Line 1, "preferable-that" should read --preferable that--.

<u>COLUMN 5</u>:

Line 1, "extending to" should read --extending--; and
Line 11, "an-insulating" should read --an insulating--.

<u>COLUMN 7</u>:

Line 13, "are obtained" should read --is obtained--;
Line 37, "can-be" should read --can be--; and
Line 67, "ratio-of" should read --ratio of--.

<u>COLUMN 8</u>:

Line 53, "exemplary" should read --an exemplary--.

<u>COLUMN 10</u>:

Line 63, "being hot" should read --being not--.

<u>COLUMN 11</u>:

Line 24, "con-tent" should read --content--; and
Line 64, "structures are" should read --structures is--.

UNITED STATES PATENT AND TRADEMARK OFFICE
CERTIFICATE OF CORRECTION

PATENT NO.        : 7,282,268 B2
APPLICATION NO.   : 10/912206
DATED             : October 16, 2007
INVENTOR(S)       : Kazuhiko Fukutani et al.

It is certified that error appears in the above-identified patent and that said Letters Patent is hereby corrected as shown below:

COLUMN 13:

Line 33, "formed" should read --are formed--; and
Line 45, "exemplary" should read --an exemplary--.

COLUMN 14:

Line 6, "target" should read --a target--.

COLUMN 15:

Line 40, "a nonvolatile" should read --and a nonvolatile--.

COLUMN 18:

Line 3, "no such a" should read --no such--;
Line 50, "a X-ray" should read --an X-ray--;
Line 55, "takes" should read --takes place--; and
Line 56, "nano-structure place." should read --nano-structure.--.

COLUMN 19:

Line 37, "was," should read --was--.

COLUMN 20:

Line 31, "is not" should read --are not--; and
Line 32, "DC-sputtering" should read --DC sputtering--.

UNITED STATES PATENT AND TRADEMARK OFFICE
CERTIFICATE OF CORRECTION

PATENT NO. : 7,282,268 B2
APPLICATION NO. : 10/912206
DATED : October 16, 2007
INVENTOR(S) : Kazuhiko Fukutani et al.

It is certified that error appears in the above-identified patent and that said Letters Patent is hereby corrected as shown below:

COLUMN 23:

Line 22, "dots-were" should read --dots were--.

Signed and Sealed this

Thirtieth Day of September, 2008

JON W. DUDAS
*Director of the United States Patent and Trademark Office*